(12) United States Patent
Kudo et al.

(10) Patent No.: US 6,559,718 B2
(45) Date of Patent: May 6, 2003

(54) SEMICONDUCTOR INTEGRATED CIRCUIT DEVICE

(75) Inventors: Ryotaro Kudo, Takasaki (JP); Shin Chiba, Takasaki (JP); Jin Kiong Ang, Penang (MY)

(73) Assignee: Hitachi, Ltd., Tokyo (JP)

( * ) Notice: Subject to any disclaimer, the term of this patent is extended or adjusted under 35 U.S.C. 154(b) by 71 days.

(21) Appl. No.: 09/782,301

(22) Filed: Feb. 14, 2001

(65) Prior Publication Data

US 2001/0015674 A1 Aug. 23, 2001

(30) Foreign Application Priority Data

Feb. 18, 2000 (JP) .......................... 2000-040924

(51) Int. Cl.[7] .............................. H03F 3/45; H03F 3/191
(52) U.S. Cl. ..................................... 330/252; 330/306
(58) Field of Search ................................ 330/252, 292, 330/298, 302, 306

(56) References Cited

U.S. PATENT DOCUMENTS 3,660,773 A * 5/1972 Free ........................ 330/255 X
5,778,089 A * 7/1998 Borza ........................ 382/124

FOREIGN PATENT DOCUMENTS

JP 4-172004 6/1992
JP 9-167827 6/1997

* cited by examiner

Primary Examiner—Steven J. Mottola
(74) Attorney, Agent, or Firm—Mattingly, Stanger & Malur, P.C.

(57) ABSTRACT

In order to decrease a change in the offset caused by high-frequency noise, filter circuits for cutting high-frequency noise are inserted between the input terminals of a differential amplifier circuit and input nodes of a differential amplifier stage, the filter circuits having a cut-off frequency which is higher than a cut-off frequency of the differential amplifier circuit but is lower than a cut-off frequency of a parasitic filter circuit constituted by a parasitic capacity and a parasitic resistance in the input unit.

9 Claims, 13 Drawing Sheets

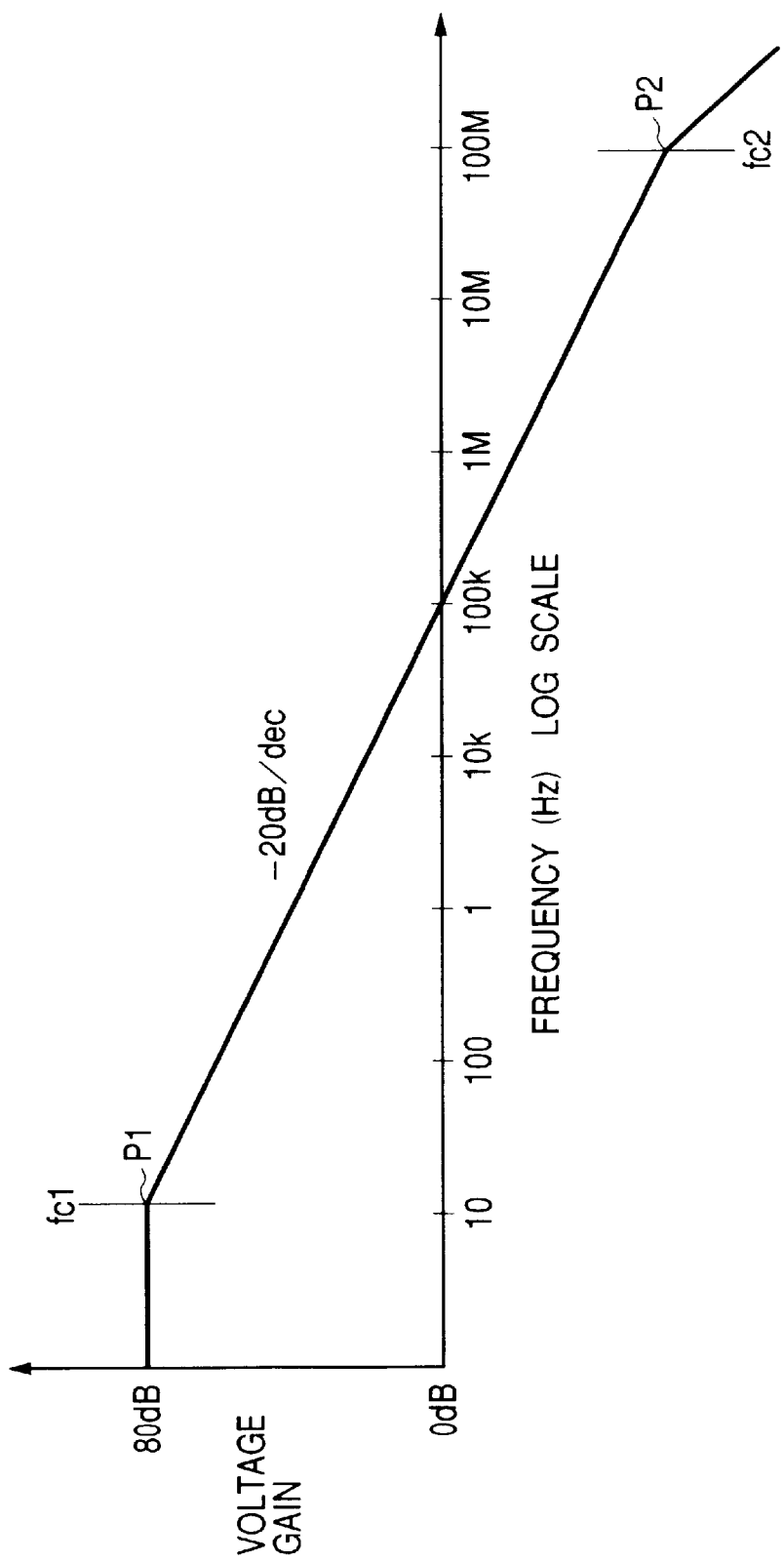

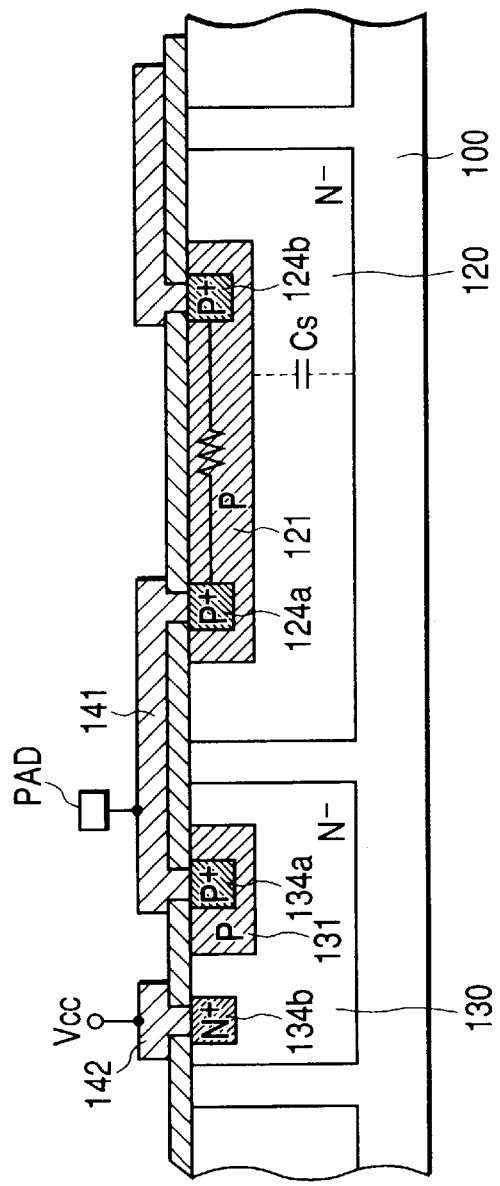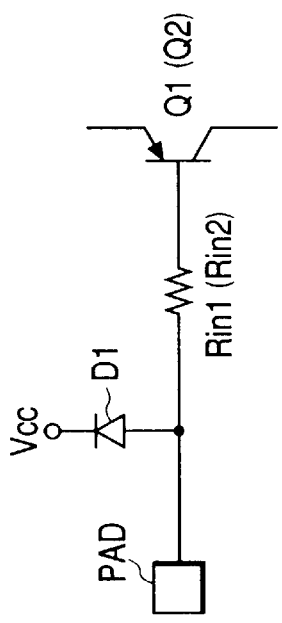
FIG. 15(A)
FIG. 15(B)

SEMICONDUCTOR INTEGRATED CIRCUIT DEVICE

BACKGROUND OF THE INVENTION

This invention relates to a semiconductor integrated circuit device. More specifically, the invention relates to technology for preventing malfunction caused by high-frequency noise that enters through input terminals of a differential amplifier circuit, such as technology effective in coping with electromagnetic wave noise in the operational amplifier IC.

A variety of circuit forms have heretofore been proposed using a differential amplifier circuit as an operational amplifier or a comparator IC for detecting the levels of analog input signals. However, systems using the semiconductor integrated circuit device are accompanied by a problem of malfunction caused by electromagnetic interference waves. On the other hand, the operational amplifier IC and the comparator IC have generally been considered to be free from the problem of malfunction that stems from the electromagnetic wave noise owing to the employment of a differential amplifier circuit that is less affected by noise of the same phase.

In recent years, however, it has been pointed out that even the operational amplifier IC and the comparator IC are subject to malfunction due to the infiltration of electromagnetic wave noise through input terminals. In order to prevent malfunction caused by electromagnetic wave noise, therefore, there has been proposed an invention according to which a filter unit which is a capacitor using an insulating film as a dielectric is formed between an input pin and a differential amplifier circuit (Japanese Patent Laid-Open No. 167827/1997).

The above proposed invention, however, simply discloses forming the filter unit which is a capacitor using an insulating film as a dielectric between the input pin and the differential amplifier circuit, but teaches none of a concrete capacity of the capacitor or a cut-off frequency of the filter unit constituted by the capacitor.

SUMMARY OF THE INVENTION

The present inventors have analyzed the causes of malfunction of the operational amplifier IC due to electromagnetic wave noise, quite independently of the above proposed invention. As a result, the inventors have discovered the occurrence of malfunction due to the mechanism described below.

First, the inventors have speculated that the cause is due to the input of different noises to an inverted input terminal and to a noninverted input terminal, since the differential amplifier circuit is immune to the noises of the same phase that enter through the inverted input terminal and the noninverted input terminal and does not malfunction. The operational amplifier IC is used in a state where an analog signal is input to one input terminal and a reference voltage is applied to the other input terminal. In this case, the lengths of wirings are different up to the inverted input terminal and up to the noninverted input terminal, and the electromagnetic wave noises do not enter under quite the same condition; i.e., noises are often out of the same phase.

As shown in FIG. 1, therefore, a circuit is formed in a manner that ground potential is applied to an inverted input terminal (−) of the operational amplifier OP through a resistor r1, an end of a feedback resistor r2 is connected thereto, and ground potential is applied to a noninverted input terminal (+) through resistors r3 and r4 connected in parallel. The resistors r1 and r3 are 51Ω, and the resistors r2 and r4 are 5.1 kΩ. The resistors r3 and r4 are connected in parallel to the noninverted input terminal (+), from such a standpoint that an input offset will not occur in the circuit under the same condition as the inverted input terminal (−) to which the two resistors r1 and r2 are connected. The cut-off frequency fc of the operational amplifier that is used is about 300 kHz.

In this circuit, first, a high-frequency noise source RF is connected to the noninverted input terminal (+) to give it false electromagnetic wave noise, high-frequency waves are input to the noninverted input terminal (+) from the high-frequency noise source RF, and an output voltage is observed while changing the frequency. Next, referring to FIG. 2, a high-frequency noise source RF is connected to the inverted input terminal (−) of the operational amplifier OP to give it false electromagnetic wave noise, high-frequency waves are input to the inverted input terminal (−), and the output voltage is observed while changing the frequency.

FIG. 3 illustrates a change in the output voltage that is observed when high-frequency noise is input to the noninverted input terminal (+), and FIG. 4 illustrates a change in the output voltage that is observed when high-frequency noise is input to the inverted input terminal (−). It is learned from FIG. 3 that when high-frequency noise is input to the noninverted input terminal (+), the output voltage Vout starts decreasing from around 1 MHz which is slightly higher than the cut-off frequency fc of the operational amplifier, becomes the lowest around 100 MHz, rises thereafter and returns to the initial level around 1 GHz. It is similarly learned from FIG. 4 that when high-frequency noise is input to the inverted input terminal (−), the output voltage Vout starts increasing from around 1 MHz which is slightly higher than the cut-off frequency fc of the operational amplifier, becomes the highest around 100 MHz, decreases thereafter and returns to the initial level around 1 GHz.

The present inventors have studied the cause of temporary increase or decrease of the output voltage Vout over a given frequency band, and have reached the conclusion that the phenomenon mentioned below is a cause.

FIG. 5 illustrates a circuit constitution of the operational amplifier OP used in the above experiment. In this operational amplifier, level shift circuits 12 and 13 constituted by emitter followers for broadening the lower-limit level of a dynamic range of input signals toward the lower side of the ground potential, are inserted in a stage preceding an active load-type differential amplifier stage 11.

FIG. 6 shows measurement of changes in a potential V1 at an input node and in a potential V2 at an output node n2 of the level shift circuit 12 at the time when a signal of a frequency lower than the cut-off frequency fc is input to the inverted input terminal (−) of the operational amplifier. In this case, as will be obvious from FIG. 6, the two potentials V1 and V2 change in the same manner being deviated by a forward voltage Vbe (about 0.7 V) across base and emitter of an input transistor Q1.

FIG. 7 illustrates changes in the potential V1 at the input node and in the potential V2 at the output node n2 of the level shift circuit 12 at the time when a signal of a frequency of about 100 MHz which is higher than the cut-off frequency fc is input to the inverted input terminal (−) of the operational amplifier. In this case, the input potential V1 varies depending upon the input, but the potential V2 at the node n2 assumes a saw-tooth wave form of a small amplitude as shown in FIG. 7, and an average DC level is considerably lower than that of FIG. 6.

As described above, the potential V2 at the node n2 assumes the saw-tooth wave form probably because a parasitic capacity Cjs between the base and the substrate of a differential transistor Q3 in a differential amplifier stage is connected to the output node n2 of the level shift circuit and, hence, a current of a current source I1 in the level shift circuit is consumed for charging the parasitic capacity Cjs when V2 increases, and the electric charge in the parasitic capacity Cjs is quickly extracted by a collector current of the input transistor Q1 when V2 decreases. It was found that when the high-frequency wave is input to the inverted input terminal (−) of the operational amplifier of FIG. 5 and the DC level of the potential V2 at the node n2 decreases, the DC level varies depending upon the frequency and amplitude of the input signal.

In the system using the above operational amplifier, however, wirings of different lengths are in many cases connected to the inverted input terminal and to the noninverted input terminal as described earlier. Accordingly, high-frequency noise due to electromagnetic waves enters in different amounts into the inverted input terminal and into the noninverted input terminal, as a matter of course, and a difference occurs between a DC level Vdc2 at the node n2 in the emitter of the transistor Q1 and a DC level Vdc2' at the node n2' in the emitter of the transistor Q2. As a result, it is considered that an offset occurs between the inverted input terminal (−) and the noninverted input terminal (+) as described above, causing the operational amplifier to malfunction.

The above hypothesis is not capable of explaining the phenomenon in that the output voltage returns to the initial value when the frequency of high-frequency noise entering through the input terminal becomes higher than a certain degree as shown in FIGS. 3 and 4 (higher than 100 MHz in these drawings). This phenomenon, however, can be explained in such a fashion that the high-frequency components are attenuated by a parasitic filter circuit that is constituted by a base resistance of the transistor Q1 itself connected to the input pin of the operational amplifier and by a parasitic capacity Cjs between the base and the substrate. Thus, the inventors have reached the conclusion that a differential amplifier circuit can be realized suppressing a change in the offset caused by high-frequency noise such as of electromagnetic waves and suppressing malfunction by cutting noise having frequencies higher than the cut-off frequency of the differential amplifier circuit but lower than the cut-off frequency of the parasitic filter circuit in the input unit.

It is therefore an object of this invention to provide a differential amplifier circuit of which the offset is little likely to be changed by high-frequency noise and a semiconductor integrated circuit device that includes the differential amplifier circuit.

Another object of this invention is to provide a differential amplifier circuit that is little likely to malfunction despite it has received electromagnetic interference waves and a semiconductor integrated circuit device that includes the differential amplifier circuit.

The above and other objects as well as novel features of the invention will become obvious from the description of the specification and the accompanying drawings.

Briefly described below are representative examples of the invention disclosed in this application.

That is, between the input terminal of the differential amplifier circuit and the input node of the differential amplifier stage, there is inserted a filter circuit for cutting high-frequency noise having a cut-off frequency higher than the cut-off frequency of the differential amplifier circuit but is lower than the cut-off frequency of the parasitic filter circuit that is constituted by a parasitic capacity and a parasitic resistance in the input node.

According to the above-mentioned means, the filter circuit for cutting high-frequency noise prevents high-frequency noise such as of electromagnetic waves infiltrated through the input terminals from being transmitted to the differential amplifier stage, and suppresses a change in the input offset caused by a difference in the DC level between the inverted input terminal (−) and the noninverted input terminal (+) triggered by the infiltration of high-frequency noises of different amplitudes.

The filter circuit for cutting the high-frequency noise can be constituted by a CR circuit that includes a resistor and a capacitor. The capacitor can be formed by positively utilizing the parasitic capacity of the transistor to which is connected one end of the resistor. Or, a capacitor element may be formed by using, as a dielectric, an insulating film formed on the semiconductor substrate, or the capacitor element may be formed by utilizing a PN junction formed on the surface of the semiconductor substrate.

When the parasitic capacity of the transistor is positively utilized to constitute the filter circuit, a relatively small area is occupied by the filter circuit. This is effective in forming a filter circuit between the level shift circuit and the differential amplifier stage in a differential amplifier circuit having a level shift circuit in a stage preceding the differential amplifier stage. This is because, there generally exists a relatively large margin near the external input terminal for laying out the elements. On the other hand, when the insulating film is used as a dielectric to form a capacitor that constitutes the filter circuit, the cut-off frequency of the filter circuit varies little depending upon the input DC voltage since the capacity varies little depending upon the voltage compared with the junction capacity.

The resistor constituting the filter circuit may be the one that utilizes parasitic resistance by forming the base region of the transistor to which the filter circuit is connected to be larger than the base regions of other transistors. Or, a semiconductor region such as of a P-type or N-type diffusion layer formed in the surface of the semiconductor substrate separately from the base region of the transistor, may be used as the resistor, or a metal layer such as a polysilicon layer may be formed on the semiconductor substrate and may be used as the resistor. When the resistor constituting the filter circuit is formed by utilizing the parasitic resistance in the base region of the transistor, the filter circuit occupies an area smaller than that of when the resistor is separately provided. In this case, the parasitic capacity of the transistor constituting the filter circuit increases, too.

It is desired that a cut-off frequency of the filter circuit for cutting the high-frequency noise is higher than a unity gain frequency of the differential amplifier circuit but is lower than a cut-off frequency of a parasitic filter circuit in the input unit. This is because the circuit easily oscillates when the cut-off frequency of the filter circuit for cutting the high-frequency noise is set to be smaller than the unity gain frequency of the differential amplifier circuit.

A diode for electrostatic protection and a filter circuit for cutting high-frequency noise may be inserted between an input terminal of the differential amplifier circuit and an input node of a differential amplifier stage. This suppresses a change in the input offset caused by the infiltration of a high-frequency noise such as electromagnetic waves through the input terminals, and enhances the electrostatic breakdown strength owing to the protection diode.

If considered from a different point of view, the electrostatic protection diode connected to the input terminal can be regarded as a junction capacitor. Therefore, when a PN junction capacitor is used, instead of the insulating-film capacitor, as a capacitor for constituting the filter circuit for cutting high-frequency noise, there can be contrived a circuit that is also used as a diode for electrostatic protection. Upon providing a filter circuit for cutting high-frequency noise separately from the diode for electrostatic protection, however, it is allowed to optimize the properties of the elements depending upon the applications. In this case, the high-frequency noise can be cut more favorably and the electrostatic breakdown strength can be enhanced as compared with when it is used in common. Further, even in case the diode for electrostatic protection becomes defective, the filter circuit for cutting high-frequency noise works effectively. The protection diode exhibits the function of protecting the internal circuit against not only the static electricity but also the surge voltage and the surge current.

BRIEF DESCRIPTION OF THE DRAWINGS

FIG. 9 is a graph showing the frequency characteristics of the differential amplifier circuit of FIG. 5 without filter circuit used for the experiment conducted prior to dealing with the present invention;

FIGS. 15A and 15B are a sectional view illustrating another structure of the resistor that constitutes the filter circuit, and a diagram of an equivalent circuit thereof;

DESCRIPTION OF THE PREFERRED EMBODIMENTS

Preferred embodiments of the invention will now be described with reference to the drawings.

Figure 8A:
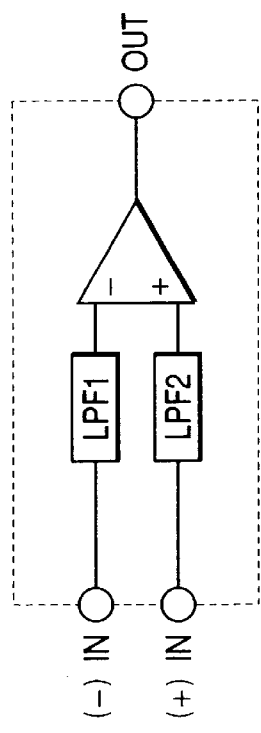
FIGS. 8A and 8B are circuit diagrams illustrating an embodiment of a differential amplifier circuit according to the present invention.
Figure 8B:
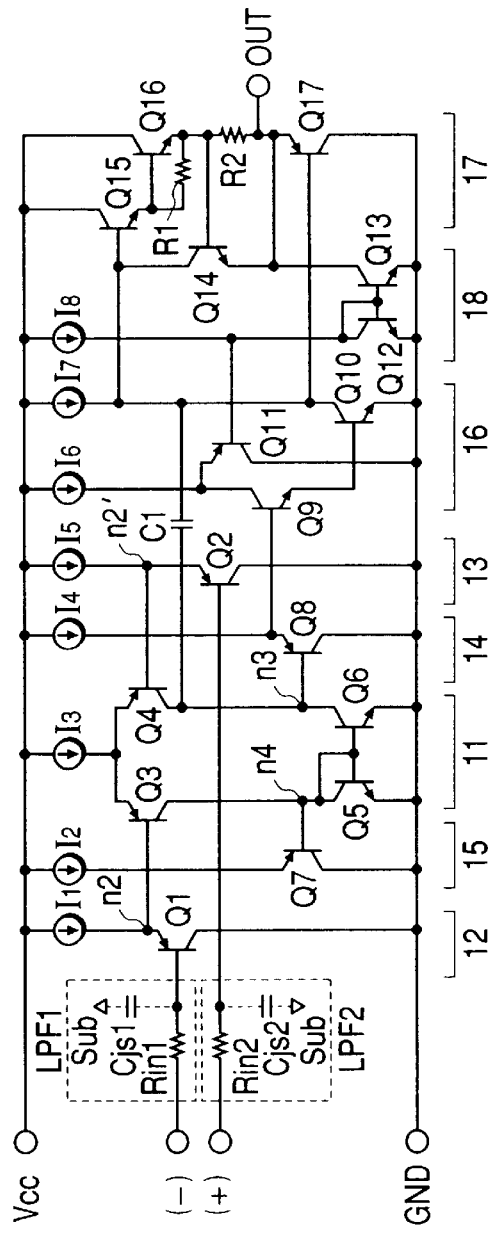

FIGS. 8A and 8B are diagrams illustrating an embodiment of an operational amplifier, i.e., a differential amplifier circuit to which the invention is applied. In this embodiment, a semiconductor integrated circuit of which the principal portions are occupied by a differential amplifier circuit is called operational amplifier, and the semiconductor integrated circuit in which other circuits are formed on a semiconductor substrate is called differential amplifier circuit. However, the circuit constitution and function do not change depending upon the names.

In this embodiment as shown in FIG. 8A, low-pass filter circuits (hereinafter simply referred to as filter circuits) LPF1, LPF2 are connected to an inverted input terminal (−) and to a noninverted input terminal (+) of the differential amplifier circuit. FIG. 8B illustrates a concrete circuit constitution thereof. In FIG. 8B, terminals (Vcc, (+), (−), GND and Out) represented by circles are external terminals of the semiconductor integrated circuit.

In FIG. 8B, reference numeral 11 denotes a differential amplifier stage constituted by a pair of differential transistors Q3 and Q4 of which the emitters are connected in common, active load transistors Q5 and Q6 constituting a current mirror connected between the grounding point GND and the collectors of Q3 and Q4, and a constant-current source I3 connected between a power source voltage Vcc and the common emitter of the differential transistors Q3 and Q4. Though there is no particular limitation, the differential transistors Q3 and Q4 are constituted by PNP bipolar transistors, and the load transistors Q5 and Q6 are constituted by NPN bipolar transistors. The constant-current source I3 can be constituted by a PNP bipolar transistor of which the base is biased with a constant voltage.

Reference numeral 12 denotes a level shift circuit which is an emitter follower provided between the inverted input terminal (−) and the base terminal of the differential transistor Q3, and reference numeral 13 denotes a level shift circuit provided between the noninverted input terminal (+) and the base terminal of the differential transistor Q4. The level shift circuit 12 is constituted by a PNP bipolar transistor Q1 of which the base terminal is connected to the inverted input terminal (−) and of which the collector is connected to the grounding point GND, and a constant-current source I1 connected between the emitter of the transistor Q1 and the power source voltage Vcc. The base terminal of the transistor Q3 of the differential input stage 11 is connected to the emitter terminal of the transistor Q1.

Similarly, the level shift circuit 13 is constituted by a PNP bipolar transistor Q2 of which the base terminal is connected to the noninverted input terminal (+) and of which the collector is connected to the grounding point GND, and a constant-current source I5 connected between the emitter of the transistor Q2 and the power source voltage Vcc. The base terminal of the transistor Q4 of the differential input stage 11 is connected to the emitter terminal of the transistor Q2. The level shift circuits 12 and 13 work to broaden the lower-limit level of the dynamic range of input signals toward the lower side of the ground potential. Concretely speaking, the potentials at output nodes n2, n2' of the level shift circuits 12, 13, i.e., the base potentials of the transistors Q3, Q4 are shifted to be higher than the base potentials of the transistors Q1, Q2, i.e., to be higher than the input signals −Vin and +Vin by a forward voltage Vbe across base and emitter of Q1 and Q2.

A level shift circuit 14 constituted by a transistor QB connected to an output nodes n3 of the differential amplifier stage 11 and by a constant-current source I4, works to bias a voltage Vce across collector and emitter of the active load transistor Q6 to become nearly equal to a voltage Vce (=Vbe) across collector and emitter of the transistor Q6. Further, a level shift circuit 15 constituted by a transistor Q7 connected to a node n4 of the differential amplifier stage 11 and a constant-current source I2, is a dummy circuit provided to eliminate an error in the current that flows into the active load transistors Q5 and Q6.

Reference numeral 16 denotes a high-gain amplifier stage connected to the level shift circuit 14, and is constituted by Darlington-connected transistors Q9 and Q10, and constant-current sources I6 and I7 connected between the collectors Q9, Q10 and the power-source voltage Vcc. Reference numeral 17 denotes an output stage which includes a transistor Q16, a resistor R2 and a transistor Q17 connected in series between the power-source voltage Vcc and the grounding point GND, and drives a load (not shown) connected to the output terminal OUT upon receiving an output from the high-gain amplifier stage 16. A transistor Q15 is connected to the base of the transistor Q16 to constitute the darlington circuit together with Q16, and a resistor R1 is connected between the emitters of these transistors Q15 and Q16.

Reference numeral 18 denotes a current-limiting circuit which suppresses a current that flows into the transistor Q16 on the power-source potential side of the output stage 17 and limits a collector current that flows into the transistor Q9. The current-limiting circuit 18 is constituted by a transistor Q14 of which the base is connected to the emitter of the output transistor Q16 and of which the collector is connected to the base of the transistor Q15, a transistor Q13 connected in series with Q14 and of which the collector is connected to the output terminal OUT, a transistor Q12 connected to Q13 to constitute a current-mirror circuit, and a transistor Q11 of which the base is connected to the collector of Q12 and of which the emitter is connected to the collector of Q9. The transistor Q13 draws part of the current from the output stage 17, and the transistor Q11 by-passes part of the current that is going to flow into the collector of the transistor Q9.

As will be obvious from FIG. 8, the transistor Q9 in the high-gain amplifier stage 16 may feed a base current of the transistor Q10. When the collector current of Q9 is too large, the base current as well as the collector current of Q10 flows too much, whereby the base current of Q17 becomes too great causing the output voltage to be deviated toward the low side. Therefore, the current-limiting circuit 18 is provided to limit the collector current that flows into the transistor Q9.

A capacitor C1 connected between the collector of the transistor Q4 in the differential input stage 11 and the collector of the transistor Q10 in the high-gain amplifier stage 16, is for compensating the phase. Upon suitably setting the capacity, the unity gain frequency (frequency at which the gain becomes 0 dB) of the differential amplifier circuit can be suppressed to be lower than the cut-off frequency of the transistor, thereby to prevent the oscillation of the circuit. The capacitor C1 for compensating the phase may be attached to the external side when its capacity is large.

Figure 5:
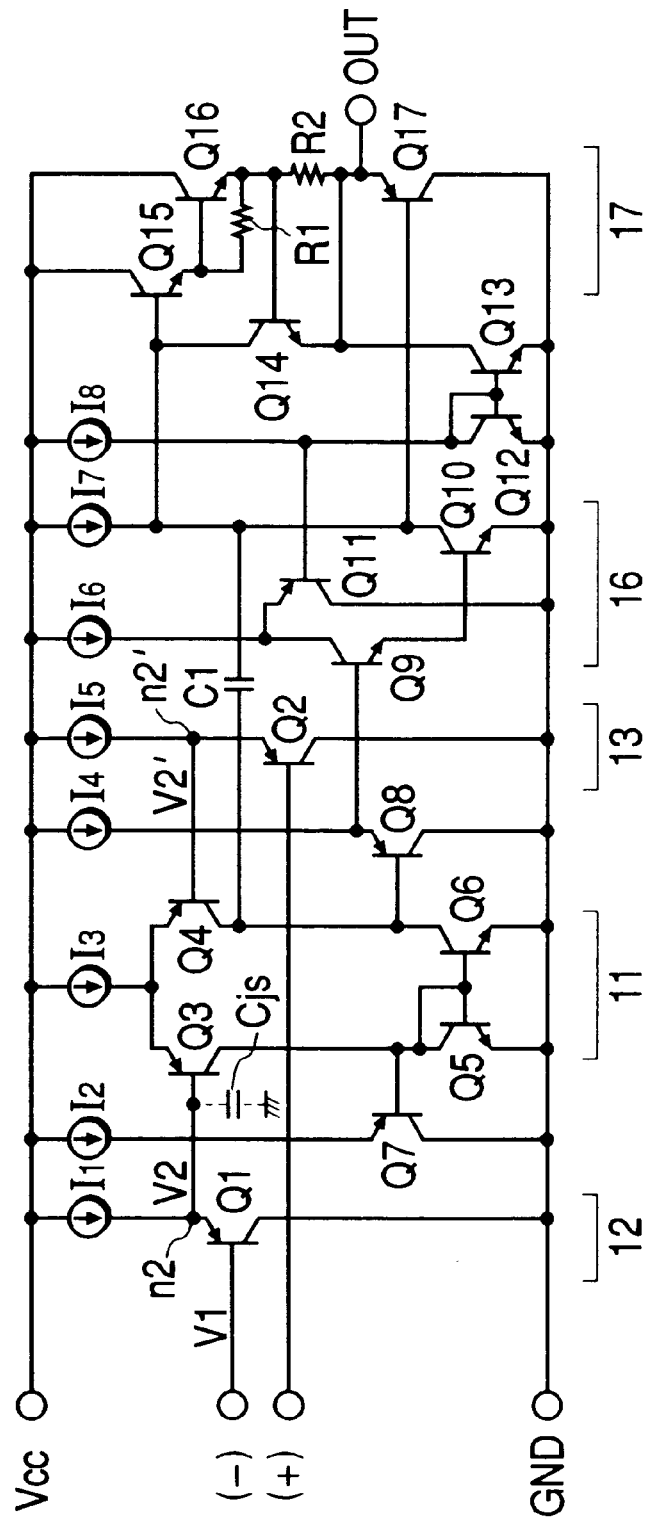
FIG. 5 is a circuit diagram illustrating a circuit constitution of the operational amplifier used in the experimental circuit of FIGS. 1 and 2.
Figure 6:
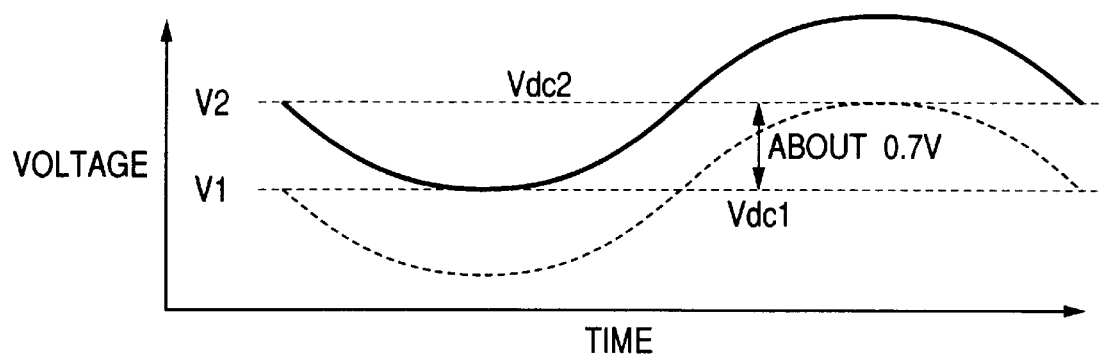
FIG. 6 is a diagram of waveforms showing changes in the input potential of the level shift circuit of the input stage and in the potential at the output node at the time when a signal of a frequency lower than the cut-off frequency is input to the inverted input terminal (−) of the operational amplifier of FIG. 5.
Figure 7:
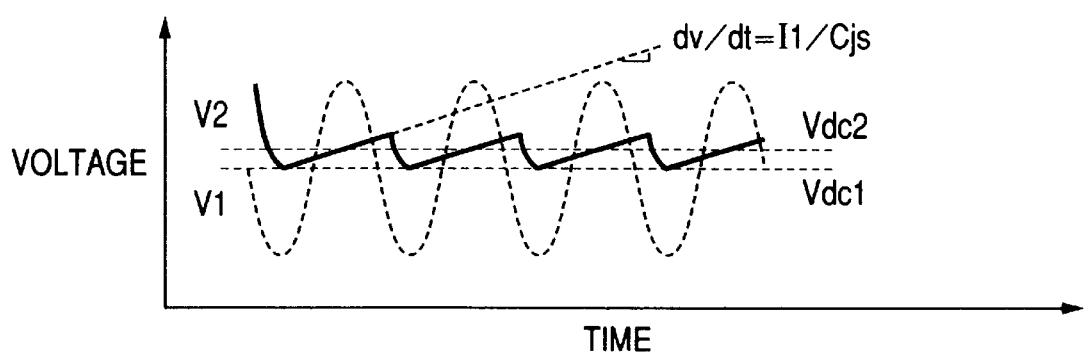
FIG. 7 is a diagram of waveforms showing changes in the input potential of the level shift circuit of the input stage and in the potential at the output node at the time when a signal of a frequency higher than the cut-off frequency is input to the inverted input terminal (−) of the operational amplifier of FIG. 5.

The constitution described in the foregoing is the same as the constitution of the differential amplifier circuit shown in FIG. 5 that was studied in developing the circuit of the invention.

In this embodiment, a resistor Rin1 is connected between the inverted input terminal (−) and the base terminal of the transistor Q1, and a resistor Rin2 is connected between the noninverted input terminal (+) and the base terminal of the transistor Q2. In order to broaden the band of the differential amplifier circuit, in general, no extra base resistor is connected to the input terminal. For electrostatic protection, however, it can be contrived to insert a resistor between the input terminal and the base of the input transistor together with the protection diode like the resistors Rin1 and Rin2 of the embodiment. In this case, the resistor has a resistance of, usually, from several tens of ohms to several hundreds of ohms. In this embodiment, the resistances of the resistors Rin1 and Rin2 are vary larger than the resistance for protection as will be described below in detail.

As described above, the resistor Rin1 is connected between the inverted input terminal (−) and the base terminal of the transistor Q1 and the resistor Rin2 is connected between the noninverted input terminal (+) and the base terminal of the transistor Q2. Then, the transistors Q1 and Q2 have parasitic capacities Cjs1 and Cjs2 between the base regions and the semiconductor substrates. Accordingly, the low-pass filter circuits LPF1 and LPF2 are constituted by the parasitic capacities Cjs1, Cjs2 and the resistors Rin1, Rin2.

When the concept of the invention was described, it was contrived to form the capacitor elements together with the resistors Rin1, Rin2 as filter circuits for connection to the input terminals. In concretely designing a circuit thereafter, however, a calculation of the capacity required for the filter circuit for cutting high-frequency noise indicated that the capacity needs be relatively small and that the parasitic capacity between the base region of the transistor and the semiconductor substrate suffices for the need. In this embodiment, therefore, parasitic capacities Cjs1, Cjs2 between the bases and the substrates of the transistors Q1, Q2 are utilized as capacitors for the filter circuits. When the parasitic capacities of the transistors are positively utilized, relatively small areas are occupied by the filter circuits.

Here, as the capacity for constituting the filter circuit for cutting high-frequency noise, a capacitor element may be provided by using an insulating film formed on the semiconductor substrate as a dielectric or a capacitor element may be provided by utilizing a PN junction formed on the surface of the semiconductor substrate, instead of positively utilizing the parasitic capacity of the transistor.

The resistor constituting the filter circuit, too, can be constituted by utilizing parasitic resistance by forming the base region of the transistor to which the filter circuit is connected to be larger than the base regions of other transistors. It is also allowable to use, as a resistor, a semiconductor region such as the P-type or N-type diffusion layer formed on the surface of the semiconductor substrate separately from the base region of the transistor. Or, a metal layer such as polysilicon layer formed on the semiconductor substrate may be used as a resistor.

Next, described below are the characteristics required by the filter circuits and resistances of the resistors Rin1 and Rin2 required for realizing the characteristics.

As described already, characteristics required for the filter circuits to prevent a change in the input offset caused by high-frequency noise input through the input pins, are to cut noise of frequencies higher than the cut-off frequency of the differential amplifier circuit but is lower than the cut-off frequency of the parasitic filter circuit in the input unit.

FIG. 9 illustrates frequency characteristics of the differential amplifier circuit of FIG. 5 without filter circuit in the input unit. As will be obvious from FIG. 9, there is a first pole PI near 10 Hz and there is a second pole P2 near 100 MHz. The unity gain frequency exists at about 100 kHz. That is, in the differential amplifier circuit of FIG. 5 without filter circuit, the voltage gain is about 80 dB constant up to a frequency of input signals of 10 Hz, and becomes −20 dB/Dec from 10 Hz to 100 MHz. Here, the frequency fc1 at the first pole P1 is a cut-off frequency of the differential amplifier circuit itself, and a frequency fc2 at the second pole P2 is a cut-off frequency of the filter circuit parasitic in the input unit of the differential amplifier circuit.

Here, a frequency ferror at which the input offset starts changing due to high-frequency noise input through the input pins, is found based on the above hypothesis, i.e., the cause thereof is due to that the parasitic capacity Cjs(Q3) (Cjs(Q4)) between the base and the substrate of the differential transistor Q3 (Q5) is electrically charged consuming the current I1 (I5) of the level shift circuit 12 (13) at the time when the potential V2 (V2') at the output node n2 (n2') of the level shift circuit 12 (13') which is the input stage rises.

When a high frequency of an amplitude Vpp is input to the base of the transistor Q1, the time Terror required for charging and discharging the parasitic capacity Cjs is expressed by the following formula, $$\text{Terror} \approx 2 \cdot Cjs(Q3) \cdot Vpp/i1 \tag{1}$$

where i1 is a current of the constant-current source I1 in the level shift circuit.

When I1=10 μA, Cjs(Q3)=1.5 pF and Vpp=0.2 V, ferror becomes 17 MHz since ferror=1/Terror. It is therefore learned that the filter circuit should cut frequencies of higher than 17 MHz.

Figure 3:
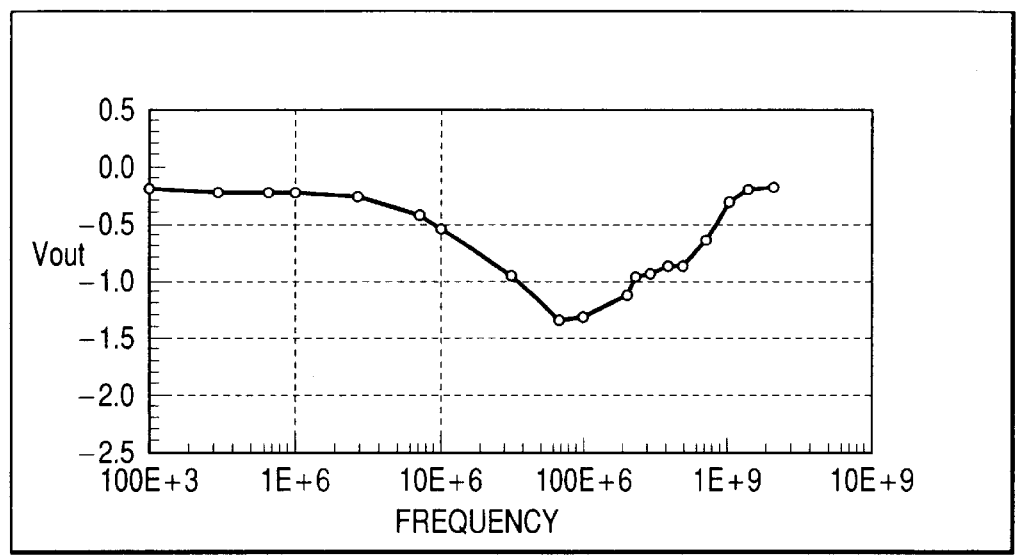
FIG. 3 is a graph illustrating frequency characteristics of the output voltage observed by using the experimental circuit of FIG. 1.
Figure 4:
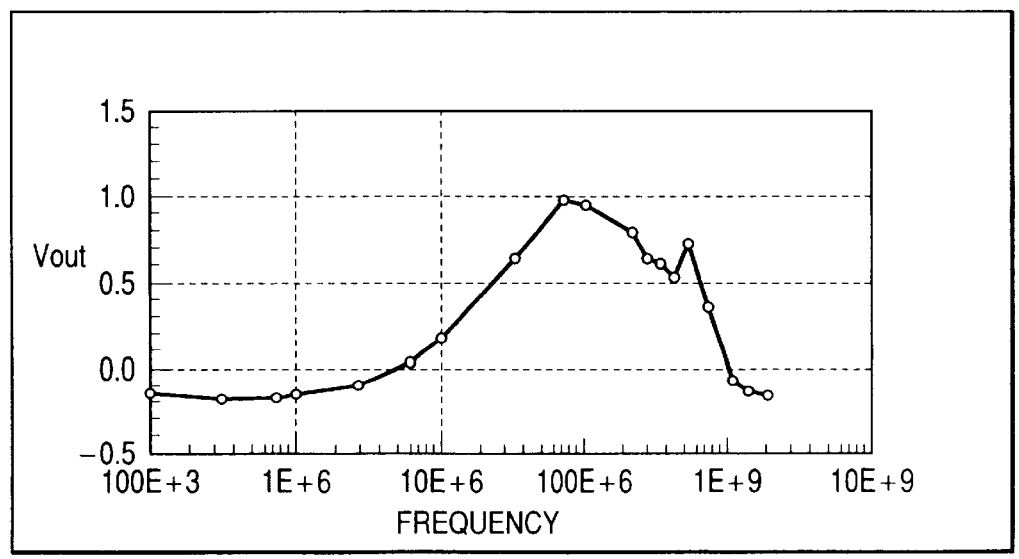
FIG. 4 is a graph illustrating frequency characteristics of the output voltage observed by using the experimental circuit of FIG. 2.

This is in good agreement with FIGS. 3 and 4 that illustrate changes in the output voltage that is observed when high-frequency noise is input to the differential amplifier circuit of FIG. 5 without filter circuit. Therefore, the cut-off frequency fc3 of the filter circuits LPF1, LPF2 newly provided in this embodiment should be higher than the cut-off frequency of the differential amplifier circuit itself but lower than 17 MHz. From the following formula, $$Rin=1/(2\pi \cdot Cjs(Q1) \cdot 10 \text{ MHz}) \tag{2}$$

the resistances of the resistors Rin1, Rin2 required for obtaining filter circuits having a cut-off frequency of 10 MHz become about 10.6 kΩ. Here, Cjs(Q1) is a parasitic capacity between the base and the substrate of the transistor Q1, which is the capacity of the filter circuit, and is about 1.5 pF.

The cut-off frequency fc3 of the filter circuit for cutting off the high-frequency noise that varies the input offset, should be higher than the cut-off frequency fc1 of the differential amplifier circuit itself as described above but should not be higher than 17 MHz. When the cut-off frequency fc3 of the filter circuit is lower than the unity gain frequency, however, the differential amplifier circuit tends to be easily oscillated. It is therefore desired to select the cut-off frequency fc3 to lie over a range higher than the unity gain frequency (100 kHz) but lower than a high frequency (17 MHz) that may cause a change in the input offset.

Figure 10:
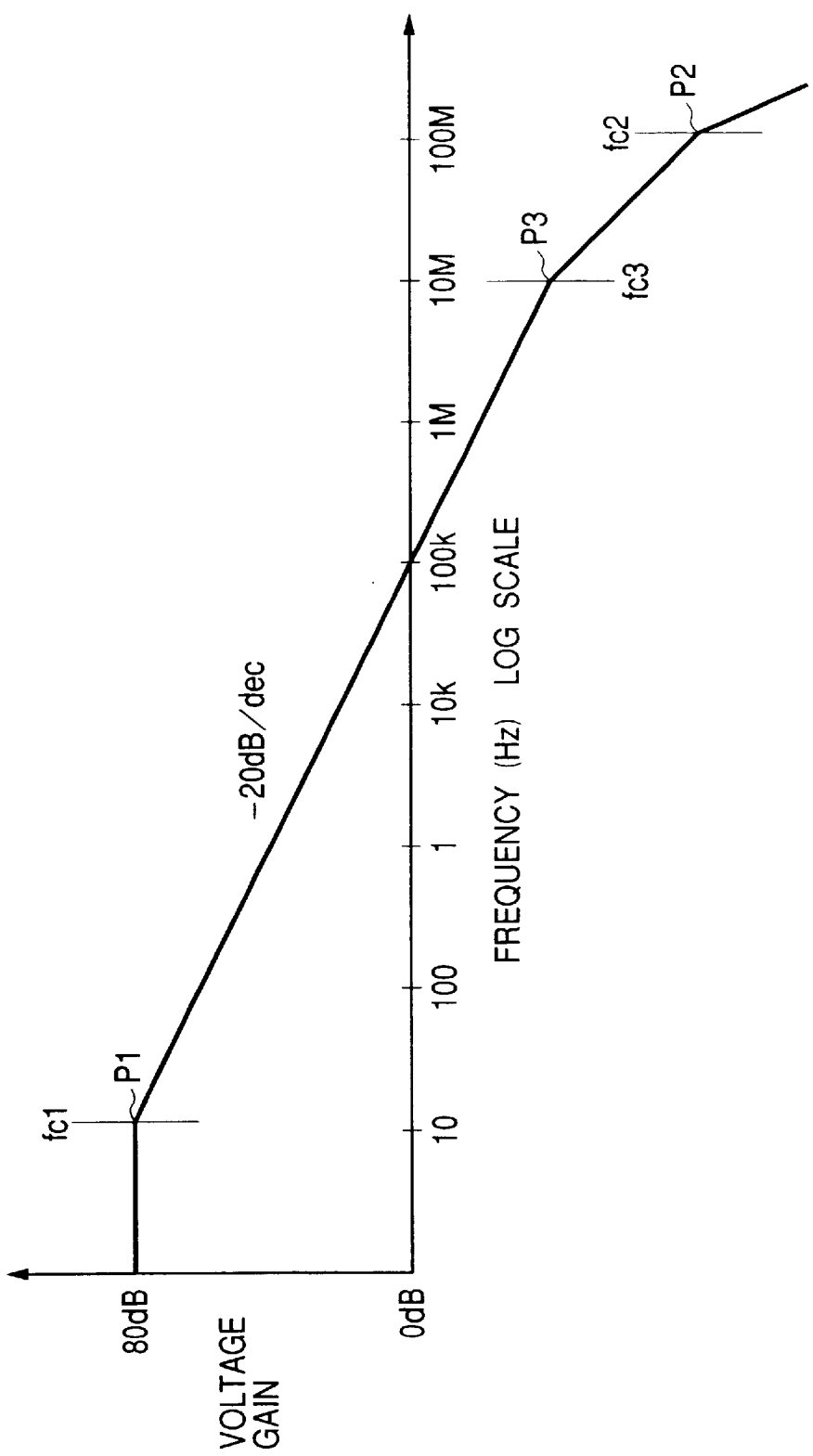
FIG. 10 is a graph showing the frequency characteristics of a differential amplifier circuit according to this invention.

FIG. 10 illustrates frequency characteristics of the differential amplifier circuit of FIG. 8 at the time when the resistors Rin1 and Rin2 constituting the filter circuits have a resistance of 10.6 kΩ.

As will be obvious from the comparison with FIG. 9, the differential amplifier circuit of this embodiment forms a new pole P3 near 10 MHz between the unity gain frequency of the circuit and the cut-off frequency fc2 of the parasitic filter circuit in the circuit. This corresponds to a cut-off frequency fc3 of the filter circuit added in this embodiment. It is learned from FIG. 10 that the application of this embodiment makes it possible to effectively cut high-frequency noise that causes a change in the input offset. As described above, further, when the resistors Rin1 and Rin2 have a resistance of 10.6 kΩ, the cut-off frequency fc3 of the filter circuit is higher by about a hundred times than the unity gain frequency of the differential amplifier circuit itself, and does not almost affect other characteristics of the circuit.

From the above formula (1), it can be contrived to shift toward the upper side the frequency at which the offset voltage starts changing by increasing the current i1 of the constant-current source I1 to cope with the matter. However, an increase in the current i1 results in an increase in the input bias current and a decrease in the lower limit of the dynamic range of input signals. It is therefore desired to provide a filter circuit as in the above embodiment. From the above formula (1), it can be further contrived to shift toward the higher side the frequency at which the offset voltage starts changing by decreasing the base region of the transistor to cope with the matter. In this case, however, the cut-off frequency fc2 of the parasitic filter circuit is shifted, too, toward the higher side; i.e., the malfunctioning region is simply shifted, which is not effective.

Figure 1:
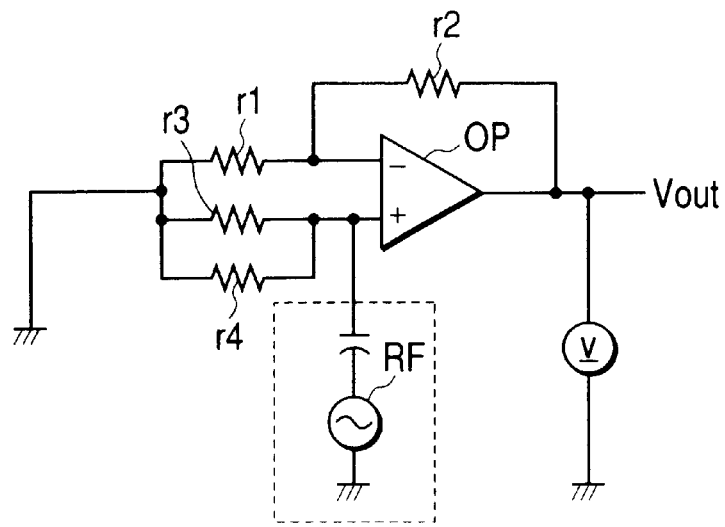
FIG. 1 is a diagram schematically illustrating an experimental circuit used for observing the output of an operational amplifier by inputting high-frequency noise to a noninverted input terminal of the operational amplifier in order to pursuit the cause of malfunction of the operational amplifier due to high-frequency noise prior to dealing with this invention.
Figure 2:
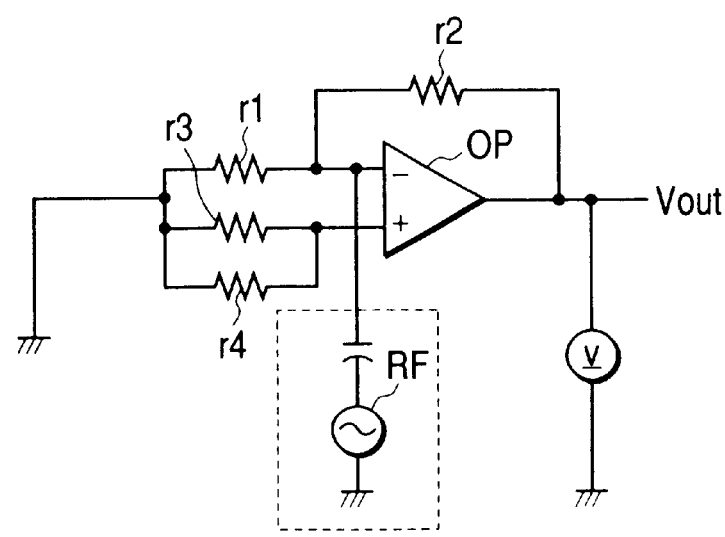
FIG. 2 is a diagram schematically illustrating an experimental circuit used for observing the output of the operational amplifier by inputting high-frequency noise to the inverted input terminal of the operational amplifier.
Figure 11A:
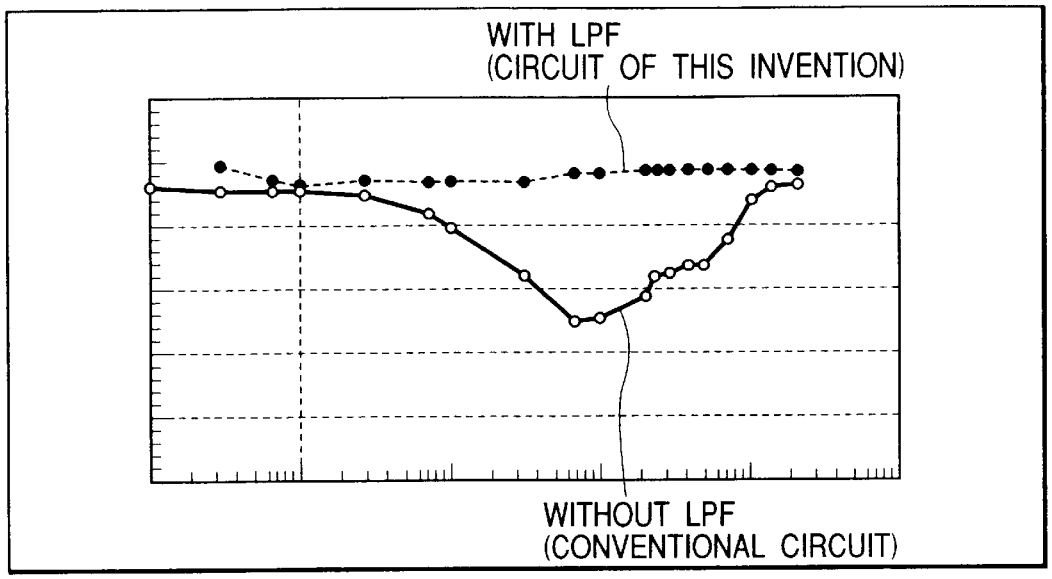
FIGS. 11A and 11B are graphs showing the observed results of output voltages of experimental circuits constituted as shown in FIGS. 1 and 2 by using the differential amplifier circuit of an embodiment and by inputting high-frequency waves to a noninverted input terminal (+) and to an inverted input terminal (−) thereof.
Figure 11B:
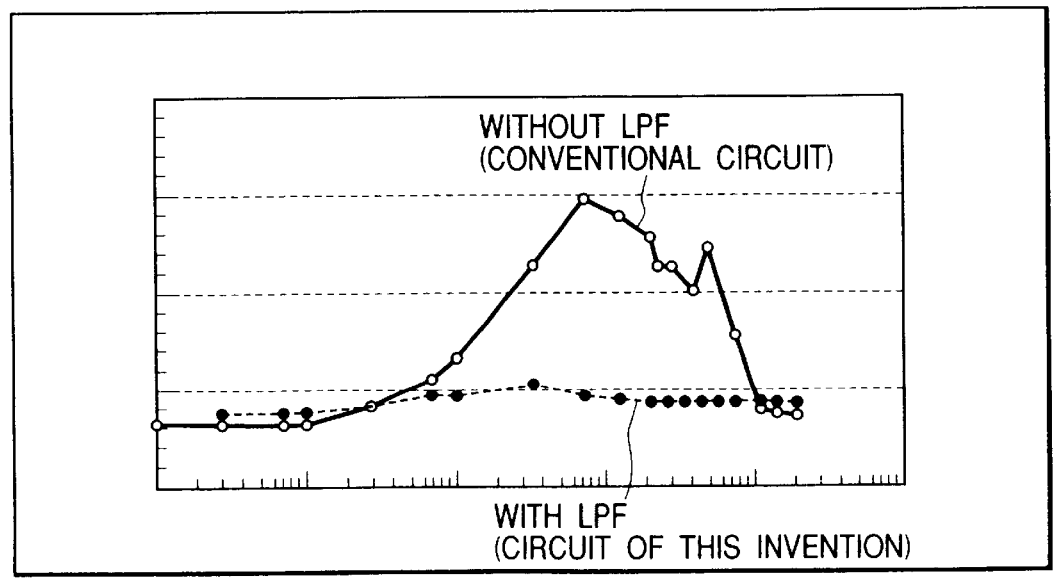

FIGS. 11A and 11B illustrate the observed results of output voltage by constituting experimental circuits like those of FIGS. 1 and 2 by using a differential amplifier circuit in which resistors Rin1 and Rin2 are attached to the input terminal as shown in FIG. 8, and by inputting a high frequency to the noninverted input terminal (+) and to the inverted input terminal (−). In these drawings, solid lines represent output voltages of the differential amplifier circuit of FIG. 5 without filter circuit, and plural dots that are plotted represent output voltages of the differential amplifier circuit of this embodiment. It will be understood from these drawings that the embodiment makes it possible to prevent a fall in the output voltage caused by high-frequency noise.

Figure 12A:
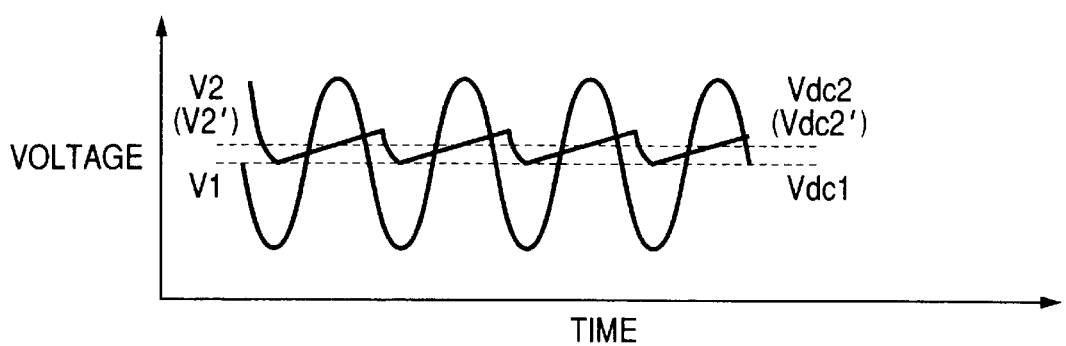
FIGS. 12A and 12B are diagrams of waveforms showing changes in the input voltage of the input stage (level shift circuit) and in the potential at the output node at the time when high-frequency signals are input to the inverted input terminal (−) of the differential amplifier circuit without filter circuit of FIG. 5 and to the inverted input terminal (−) of the differential amplifier circuit according to this invention.
Figure 12B:
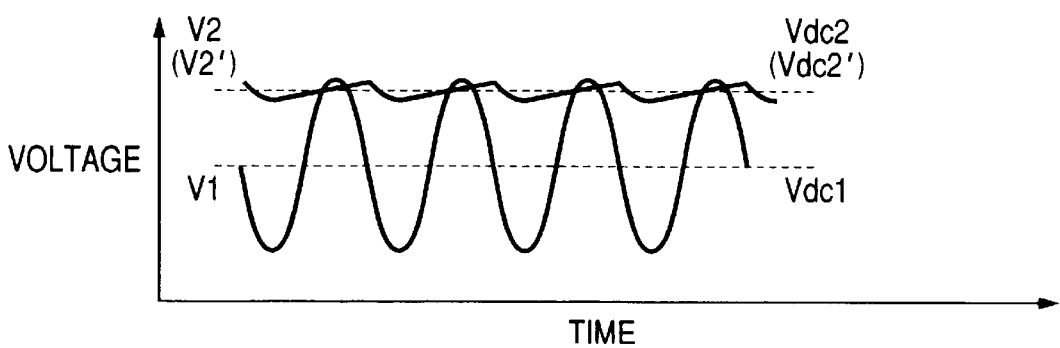

FIGS. 12A and 12B illustrate changes in the base potential V1 of the input transistor Q1 or Q2 and in the potential V2 (V2') at the output node n2, n2' at the time when a high frequency is input to either input terminal of the differential amplifier circuit in which the resistors Rin1 and Rin2 are attached to the input terminals as shown in FIG. 8 [FIG. 12B], and a change in the potential at the corresponding node at the time when no resistor is attached as shown in FIG. 5 [FIG. 12A]. From FIG. 12A, the DC level at the node n2 drops when the resistors Rin1 and Rin2 are not attached. When the resistors Rin1 and Rin2 are attached, however, the DC level at the node n2 does not drop, and the input offset is not deviated. Therefore, the differential amplifier circuit provided with the filter circuit is prevented from malfunctioning despite of input of high-frequency noise.

Next, described below is the constitution of the capacitor constituting the filter circuits LPF1 and LPF2.

As described above, the capacitors LPF1 and LPF2 constituting the filter circuits are formed by utilizing parasitic capacities between the bases and the substrates of the transistors Q1 and Q2, by forming capacitor elements by using an insulating film formed on the semiconductor substrate as a dielectric, or by forming capacitor elements by utilizing a PN junction formed on the surface of the semiconductor substrate.

Figure 13A:
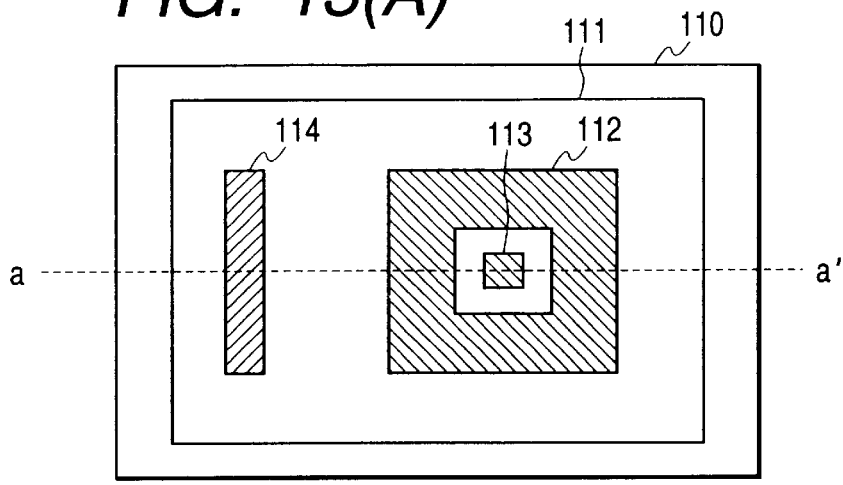
FIGS. 13A and 13B are a plan view and a sectional view illustrating the structure of a capacitor that constitutes a filter circuit used in the differential amplifier circuit according to the invention.
Figure 13B:
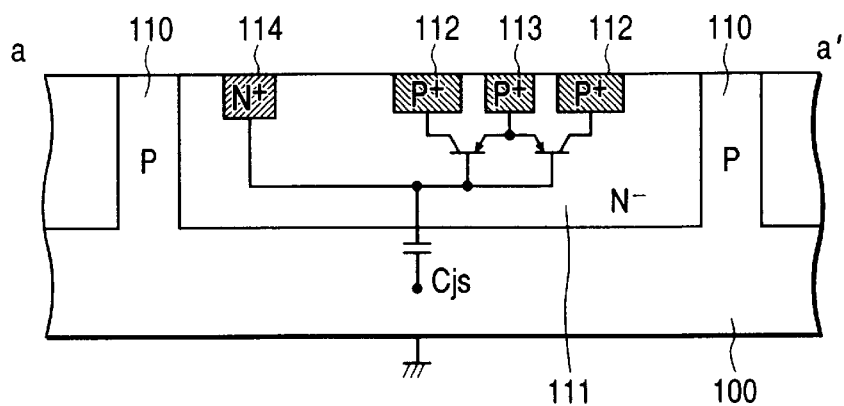

FIGS. 13A and 13B illustrate the case of utilizing parasitic capacities between the bases and the substrates of the transistors among them. Here, the transistors that utilize the parasitic capacities are the transistors Q1 and Q2 in FIG. 8. FIG. 13A is a plan view of a horizontal PNP transistor, and FIG. 13B is a sectional view along the line a–a'. In FIGS. 13A and 13B, reference numeral 100 denotes a P-type semiconductor substrate, 111 denotes a base region constituted by an N-type epitaxial layer formed on the substrate 100 and surrounded by a P-type isolation region 110, reference numeral 112 denotes a collector region which is a P-type region of a high concentration formed like a rectangular frame on the base region 100, reference numeral 113 denotes an emitter region which is a P-type region of a high concentration formed in the collector region, and 114 denotes a base contact region which is an N-type region of a high concentration.

In the case of the lateral PNP transistor as will be understood from the drawings, the base region is relatively large, and the parasitic capacity Cjs between the base and the substrate assumes a relatively large value. Concretely speaking, when the N-type epitaxial layer has a resistivity of 5 Ω/cm and a thickness of 17 μm, the junction capacity becomes about 3.0 pF at a potential difference of 0 V. Since this is the junction capacity, the thickness of the depletion layer varies depending upon the voltage across the terminals, and the capacity varies. Even when a high potential is applied, the junction capacity of up to about 1.5 pF can be accomplished. Therefore, there is no need of separately providing the capacitor element to constitute the filter circuit. When a capacity slightly larger than the above one is necessary, the base region of the transistor may be formed in a large size to increase the parasitic capacity.

Next, described below is the structure of the resistors Rin1 and Rin2 constituting the filter circuits LPF1 and LPF2.

As described above, the resistors Rin1 and Rin2 constituting the filter circuits LPF1 and LPF2 can be formed by utilizing parasitic resistances by forming the base regions of the transistors to which the filter circuits are connected to be larger than the base regions of other transistors, by forming semiconductor regions such as P-type or N-type diffusion layers on the surface of the semiconductor substrate separately from the base regions of the transistors and using them as resistors, or by using metal layers such as polysilicon layers formed on the semiconductor substrate.

Figure 14:
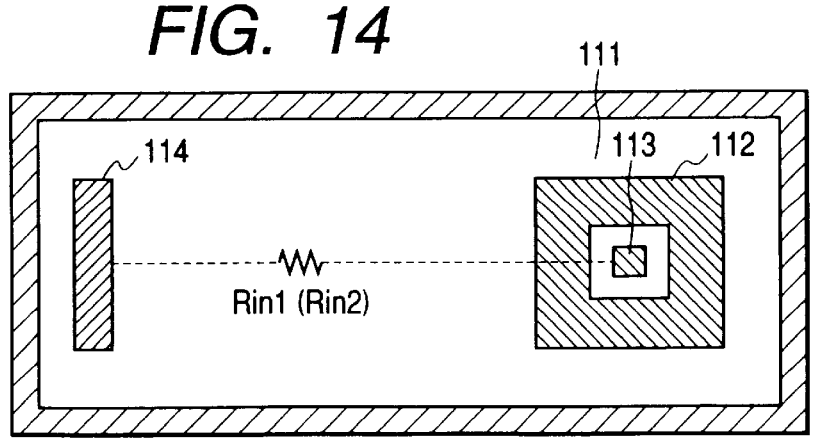
FIG. 14 is a sectional view illustrating the structure of a resistor that constitutes the filter circuit used in the differential amplifier circuit according to the invention.

FIG. 14 illustrates the constitution in the case of utilizing parasitic resistance in the base region of the transistor among them. Here, the transistors that utilize parasitic resistances are the transistors Q1 and Q2 in FIG. 8. As will be obvious from the comparison of FIG. 14 with FIG. 13, the transistor of FIG. 14 has a base region 111 that is formed long laterally compared with the transistor of FIG. 13, and has the base contact region 114, i.e., has a base electrode formed at a position separated away from the emitter or the collector region 112. Therefore, parasitic resistances of the epitaxial layer itself constitute the resistors Rin1 and Rin2 of the filter circuits.

FIG. 15A illustrates the constitution at the time when P-type diffusion layers are formed on the surface of the semiconductor substrate separately from the base regions of the transistors and are used as resistors. In the diagramed example, a P-type region 121 is formed on an island 120 of an N-type epitaxial layer, and contact regions 124a and 124b of P-type regions of a high concentration are provided at both ends of the P-type region 121. The P-type region 121 that serves as the resistor can be formed simultaneously with the P-type region which serves as the base region for an NPN vertical bipolar transistor that is not shown, and the contact regions 124a and 124b can be formed simultaneously with the P-type regions of a high concentration that serve as the collector region and the emitter region of the lateral PNP transistor shown in FIG. 12.

In this embodiment, a parasitic capacity Cs exists between the P-type region 121 that becomes a resistor element and the island 120 of the N-type epitaxial layer, and can be used as the capacity for forming a filter circuit. Besides, a parasitic PN junction diode Ds exists between the P-type region 121 and the island 120 of the N-type epitaxial layer. Upon connecting the island 120 of the N-type epitaxial layer to a high potential such as power source voltage Vcc, therefore, the parasitic PN junction diode Ds can be used as an electrostatic protection diode on the high-potential side connected to the input terminal.

Here, the island 120 of the N-type epitaxial layer can be biased with an input voltage by connecting a wiring extended from the input pad instead of being biased by connection to the power source voltage Vcc. In this case, there is obtained an advantage in that the input terminal voltage is avoided from being clamped to Vcc by the protection diode in case the input signal level becomes higher than the power-source voltage Vcc during the normal operation.

As described above, the parasitic PN junction diode Ds between the P-type region 121 and the island 120 of the N-type epitaxial layer may be utilized as an electrostatic protection diode on the high potential side. In the embodiment of FIG. 15A, however, the diode for electrostatic protection connected to the input terminal (input pad PAD) is separately constituted. The diode for electrostatic protection has a structure in which a P-type region 131 is formed on the island 130 of the N-type epitaxial layer, and a contact region 134a is provided being constituted by a P-type region of a high concentration. A PN junction between the P-type region 131 and the epitaxial layer 130 is utilized as a protection diode. To the contact region 134a is brought into contact an electrode 141 that is connected to the input terminal and that serves as an anode terminal of the protection diode. An N-type region 134b of a high concentration formed near the P-type region 131 in the surface of the epitaxial layer 130, is a contact region to which is brought into contact an electrode 142 that serves as a cathode terminal of the protection diode D1 connected to the power-source voltage Vcc. FIG. 15B is a diagram of an equivalent circuit.

By providing the electrostatic protection diode separately from the filter circuit for cutting high-frequency noise, as described above, it is allowed to optimize the characteristics of the elements depending upon the use. Compared with when it is used in common, therefore, high-frequency noise is favorably cut and the electrostatic breakdown strength can be increased. In FIG. 15A, further, a wiring may be connected to the P-type region 131 to apply the ground potential GND instead of connecting the wiring thereto from the input pad, and the wiring may be connected to the N-type region 134b of the high concentration from the input pad, to realize an electrostatic protection diode of the low potential side. The electrostatic protection diode on the low potential side can also be constituted by utilizing the junction between the epitaxial layer and the substrate.

Figure 16:
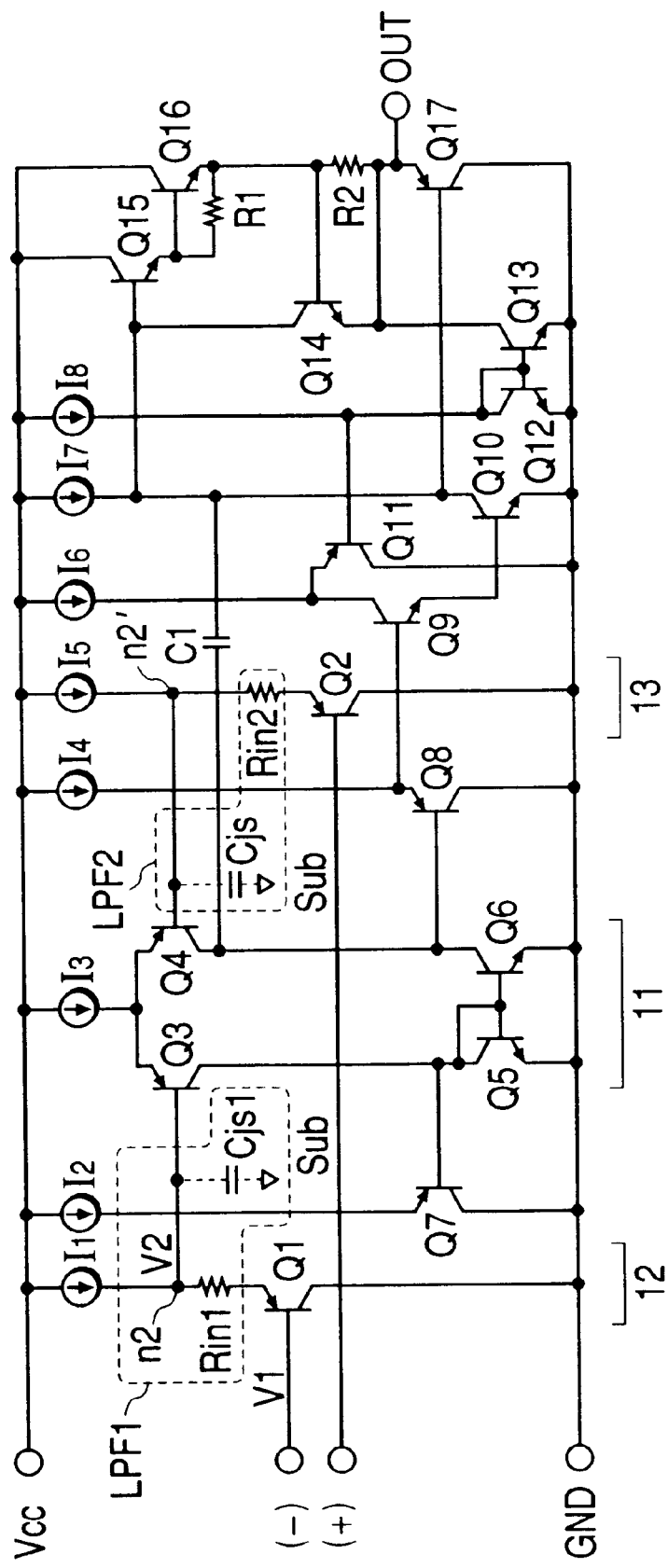
FIG. 16 is a circuit diagram of the differential amplifier circuit according to another embodiment of the invention.

FIG. 16 illustrates another embodiment of the differential amplifier circuit according to the present invention.

In the differential amplifier circuit of FIG. 8, the filter circuits LPF1 and LPF2 are provided between the input terminals and the level shift circuits 12, 13. In this embodiment, on the other hand, the filter circuits LPF1 and LPF2 are provided between the level shift circuits 12, 13 and the differential amplifier stage 11. Concretely speaking, resistors Rin1 and Rin2 that constitute the filter circuits LPF1, LPF2 are connected between the transistors Q1, Q2 and the input nodes n2, n2' of the differential amplifier stage 11, and parasitic capacities Cjs between the bases and the substrates of the transistors Q3, Q4 of the differential amplifier stage 11 are utilized as capacitors.

In the differential amplifier circuit of this embodiment, the resistors Rin1 and Rin2 limit currents discharged from the parasitic capacities Cjs between the bases and the substrates of the transistors Q3, Q4 in the differential amplifier stage 11 when high-frequency noise has entered through the input terminal, in order to dull the detection characteristics of the level shift circuits 12 and 13. This makes it possible to prevent a decrease in the DC level at the nodes n2 and n2' caused by high-frequency noise and to suppress a change in the offset.

In this embodiment, too, the resistors Rin1, Rin2 and capacitors constituting the filter circuits LPF1 and LPF2 can be varied in a variety of ways in a manner as described in the embodiment of FIG. 8. When electrostatic protection diodes are provided together with the filter circuits, however, the protection diodes are connected to the input terminals like in the embodiment of FIG. 8. In this case, the protection diodes are electrically separated from the filter circuits through the transistors Q1 and Q2.

Figure 17:
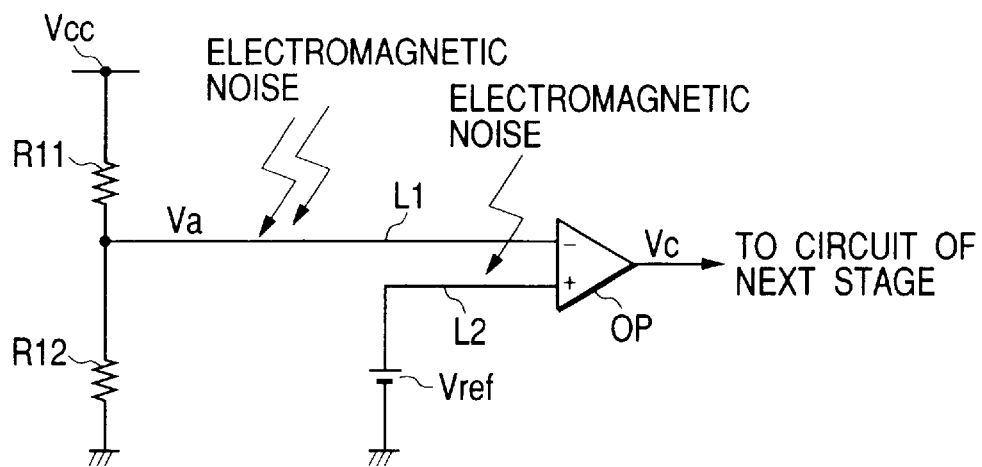
FIG. 17 is a circuit diagram of a system applying the differential amplifier circuit of the invention.

Described below with reference to FIG. 17 is a system applying the operational amplifier that uses the differential amplifier circuit constituted as described above.

FIG. 17 is a power-source voltage-monitoring circuit utilizing the operational amplifier. The inverted input terminal (−) of the operational amplifier OP receives a potential Va at a node nil of a resistance-dividing circuit consisting of resistors R11 and R12 connected in series between the power-source voltage Vcc and the grounding point GND, and the noninverted input terminal (+) of the operational amplifier OP receives a reference voltage Vref that is to be compared with Va.

In the operational amplifier using the differential amplifier circuit shown in FIG. 5 without filter circuit in the input unit as will be easily understood with reference to FIG. 17, the wiring L1 from the resistance-dividing circuit to the inverted input terminal (−) has a length different from that of the wiring L2 that feeds a reference voltage Vref to the noninverted input terminal (+), and high-frequency noises such as electromagnetic wave noises of different intensities enter into the input terminals. When the wiring L1 is longer than L2 as shown, the high-frequency noise entering through the inverted input terminal (−) becomes larger.

Figure 18:
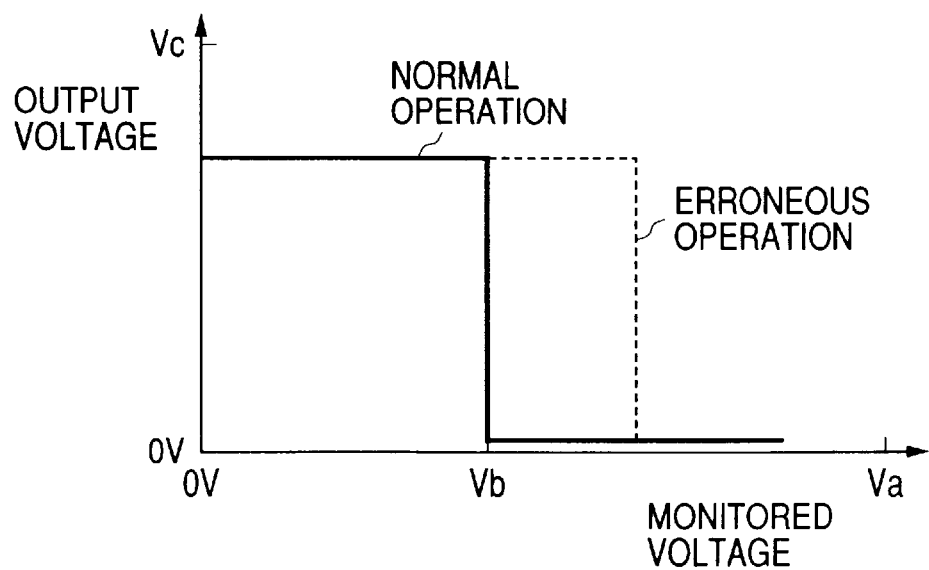
FIG. 18 is a graph illustrating input/output characteristics of the differential amplifier circuit in the system of FIG. 17.

In the operational amplifier of FIG. 5 without filter circuit in the input unit, therefore, the offset so changes as to become lower on the side of the inverted input terminal (−). In the power-source voltage-monitoring circuit of FIG. 17 using the operational amplifier, therefore, the apparent detection level becomes high as represented by a broken line relative to the true detection level represented by a solid line in FIG. 18, and the circuit may malfunction. In the power-source voltage-monitoring circuit using the operational amplifier of FIG. 8 or FIG. 16 having filter circuits in the input unit, on the other hand, the high-frequency noise is cut by the filter circuits, and the detection level does not change. Accordingly, the circuit does not malfunction.

The system of FIG. 17 is merely an example of application, and the operational amplifier to which the invention is adapted is in no way limited to the system of FIG. 17, as a matter of course. In the differential amplifier circuit that works as an operational amplifier in a system shown in FIG. 17, both the inverted input terminal and the noninverted input terminal are connected to external pins that serve as external terminals. When the differential amplifier circuit is incorporated in the semiconductor integrated circuit together with other circuit, however, only one input terminal may be connected to an external pin. In this case, electromagnetic wave noise entering into the inverted input terminal and the noninverted input terminal, tends to lose balance. Therefore, this invention can be effectively adapted.

Though the invention accomplished by the present inventors was concretely described above by way of embodiments, it should be noted that the invention is in no way limited to the above embodiments only but can be modified in a variety of ways without departing from the spirit and scope of the invention. In the differential amplifier circuit of the embodiment shown in FIG. 8, the cut-off frequency of the circuit is 10 Hz. This is because, the differential amplifier circuit is expected to be used for the power-source voltage-monitoring circuit (comparator) shown in FIG. 15. For other applications, the differential amplifier circuit may be designed to exhibit a higher cut-off frequency. It needs not be pointed out that the invention can be adapted to such cases, too.

In the circuit shown in FIG. 15B, the diode for electrostatic protection is connected between the power source voltage Vcc and the input terminal IN. However, a similar diode for electrostatic protection may be connected between the input terminal and the grounding point. The embodiments have dealt with the differential amplifier circuit in which the input transistors (Q1, Q2) were PNP bipolar transistors. The invention, however, can further be adapted to a differential amplifier circuit in which the input transistors (Q1, Q2) are NPN bipolar transistors as well as to a differential amplifier circuit constituted by using MOSFETs instead of bipolar transistors.

The foregoing description has chiefly dealt with the case where the invention accomplished by the present inventors was adapted to the operational amplifier IC in the field of utilization that served as the background of the invention. The invention, however, is in no way limited thereto only but can also be utilized for the differential amplifier circuit incorporated in the semiconductor integrated circuit having an analog circuit such as an AD converter circuit. The differential amplifier according to the invention is particularly effective when the input terminals thereof are connected to the external pins.

Briefly described below is the effect obtained by a representative example of the invention disclosed in this application.

That is, the differential amplifier circuit to which the invention is applied prevents high-frequency noise such as electromagnetic waves entered through the input terminals from being transmitted to the differential amplifier stage, suppresses a change in the input offset caused by the infiltration of unbalanced high-frequency noise and, hence, makes it possible to build up a system which malfunctions little despite of receiving the electromagnetic interference waves.

What is claimed is:

1. A semiconductor integrated circuit device comprising:
    an inverted input terminal;
    a noninverted input terminal;
    a differential amplifier circuit having a differential amplifier stage with an inverted input node and a noninverted input node;
    a first filter circuit between the inverted input terminal and the inverted input node of the differential amplifier stage, having a cut-off frequency which is higher than a cut-off frequency of the differential amplifier circuit but is lower than a cut-off frequency of a parasitic filter circuit including a parasitic capacity and a parasitic resistance in an input unit of the differential amplifier circuit; and
    a second filter circuit between the noninverted input terminal and the noninverted input node of the differential amplifier stage, having a cut-off frequency which is higher than the cut-off frequency of the differential amplifier circuit but is lower than the cut-off frequency of a parasitic filter circuit including a parasitic capacity and a parasitic resistance in the input unit of the differential amplifier circuit.

2. A semiconductor integrated circuit device according to claim 1, wherein the cut-off frequency of each of the first filter circuit and the second filter circuit is higher than a unity gain frequency of the differential amplifier circuit but is lower than the cut-off frequency of the parasitic filter circuit in the input unit of the differential amplifier circuit.

3. A semiconductor integrated circuit device according to claim 1, further comprising a first level shift circuit between the inverted input terminal and the inverted input node of the differential amplifier stage, and wherein the first filter circuit is provided between the inverted input terminal and the first level shift circuit, and a second level shift circuit between the noninverted input terminal and the noninverted input node of the differential amplifier stage, and wherein the second filter circuit is provided between the noninverted input terminal and the second level shift circuit.

4. A semiconductor integrated circuit device according to claim 1, further comprising a first level shift circuit between the inverted input terminal and the inverted input node of the differential amplifier stage, and wherein the first filter circuit is provided between the first level shift circuit and the inverted input node of the differential amplifier stage, and a second level shift circuit between the noninverted input terminal and the noninverted input node of the differential amplifier stage, and wherein the second filter circuit is provided between the second level shift circuit and the noninverted input node of the differential amplifier stage.

5. A semiconductor integrated circuit device according to claim 1, wherein each of the first filter circuit and the second filter circuit includes a resistor and a capacitor, the capacitor being a parasitic capacity of a transistor to which is connected an end of the resistor.

6. A semiconductor integrated circuit device comprising:
    an inverted input terminal;
    a noninverted input terminal;
    a differential amplifier circuit having a differential amplifier stage with an inverted input node and a noninverted input node;
    a first diode for electrostatic protection, coupled to the inverted input terminal;
    a second diode for electrostatic protection, coupled to the noninverted input terminal;
    a first filter circuit for cutting high-frequency noise between the inverted input terminal and the inverted input node of the differential amplifier stage; and
    a second filter circuit for cutting high-frequency noise between the noninverted input terminal and the noninverted input node of the differential amplifier stage.

7. A semiconductor integrated circuit device according to claim 6, further comprising a first level shift circuit between the inverted input terminal and the inverted input node of the differential amplifier stage, and wherein the first filter circuit is provided between the inverted input terminal and the first level shift circuit, and a second level shift circuit between the noninverted input terminal and the noninverted input node of the differential amplifier stage, and wherein the second filter circuit is provided between the noninverted input terminal and the second level shift circuit.

8. A semiconductor integrated circuit device according to claim 6, further comprising a first level shift circuit between the inverted input terminal and the inverted input node of the differential amplifier stage, and wherein the first filter circuit is provided between the first level shift circuit and the inverted input node of the differential amplifier stage, and a second level shift circuit between the noninverted input terminal and the noninverted input node of the differential amplifier stage, and wherein the second filter circuit is provided between the second level shift circuit and the noninverted input node of the differential amplifier stage.

9. A semiconductor integrated circuit device according to claim 6, wherein each of the first filter circuit and the second filter circuit includes a resistor and a capacitor, the capacitor being a parasitic capacity of a transistor to which is connected an end of the resistor.

* * * * *